United States Patent
Wen et al.

(10) Patent No.: US 12,411,528 B2
(45) Date of Patent: Sep. 9, 2025

(54) PORTABLE ELECTRONIC DEVICE

(71) Applicant: Acer Incorporated, New Taipei (TW)

(72) Inventors: Chun-Hung Wen, New Taipei (TW); Chun-Hsien Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 175 days.

(21) Appl. No.: 18/492,791

(22) Filed: Oct. 24, 2023

(65) Prior Publication Data
US 2024/0143038 A1    May 2, 2024

(30) Foreign Application Priority Data
Nov. 2, 2022    (TW) .................................. 111141740

(51) Int. Cl.
| | | |
|---|---|---|
| *G06F 1/16* | (2006.01) | |
| *G06F 1/20* | (2006.01) | |
| *H05K 7/20* | (2006.01) | |

(52) U.S. Cl.
CPC ............ *G06F 1/1656* (2013.01); *G06F 1/203* (2013.01); *H05K 7/20172* (2013.01); *H05K 7/20409* (2013.01)

(58) Field of Classification Search
CPC ....... G06F 1/203; G06F 1/20; H05K 7/20145; H05K 7/20181; H05K 7/20136; H05K 7/20154; H05K 7/20172; H05K 7/20209; F28F 19/008; F28F 3/02; F28F 19/01
See application file for complete search history.

(56) References Cited

U.S. PATENT DOCUMENTS

| | | | | |
|---|---|---|---|---|
| 7,345,874 | B2 * | 3/2008 | Cheng ..................... | G06F 1/20 165/104.33 |
| 8,055,392 | B2 * | 11/2011 | Kitamura ........... | G05B 23/0235 123/41.1 |
| 8,256,495 | B2 * | 9/2012 | Hattori ................... | G06F 1/203 165/200 |
| 8,717,756 | B2 * | 5/2014 | Ito .......................... | G06F 1/203 361/679.48 |
| 2009/0223649 | A1 * | 9/2009 | Lee .......................... | F28G 1/08 165/95 |
| 2010/0073867 | A1 * | 3/2010 | Tachikawa .............. | G06F 1/203 361/679.48 |
| 2010/0079947 | A1 * | 4/2010 | Aoki ....................... | G06F 1/203 361/695 |

(Continued)

FOREIGN PATENT DOCUMENTS

| | | |
|---|---|---|
| CN | 207475767 | 6/2018 |
| CN | 207965748 | 10/2018 |

(Continued)

*Primary Examiner* — Abhishek M Rathod
(74) *Attorney, Agent, or Firm* — JCIPRNET

(57) ABSTRACT

A portable electronic device including a casing, a heat source, a fan, a heat dissipation fin, a heat pipe and a dust collecting member is provided. The heat source, the fan, the heat dissipation fin, and the heat pipe are located inside the casing, and the heat pipe is thermally coupled between the heat source and the heat dissipation fin. The dust collecting member is detachably assembled to the casing and is inserted into the casing. The heat dissipation fin is disposed as corresponding to the fan, and the dust collecting member is located between the fan and the heat dissipation fin.

8 Claims, 5 Drawing Sheets

(56) References Cited

U.S. PATENT DOCUMENTS

2010/0097764 A1* 4/2010 Likubo ............... G06F 1/20
                                                    361/697
2013/0027881 A1* 1/2013 Goto ................ G06F 1/203
                                                    361/697

FOREIGN PATENT DOCUMENTS

TW        200704353       1/2007
TW        201443624      11/2014

* cited by examiner

PORTABLE ELECTRONIC DEVICE

CROSS-REFERENCE TO RELATED APPLICATION

This application claims the priority benefit of Taiwan application serial no. 111141740, filed on Nov. 2, 2022. The entirety of the above-mentioned patent application is hereby incorporated by reference herein and made a part of this specification.

BACKGROUND

Technical Field

The disclosure relates to a portable electronic device, and in particular to a portable electronic device with dust collection design.

DESCRIPTION OF RELATED ART

The host of a common notebook computer is provided with an air-cooled forced heat dissipation mechanism to quickly dissipate the heat inside the host to the outside. The air-cooled forced heat dissipation mechanism includes a fan, a heat dissipation fin, and a heat pipe. A condensation end of the heat pipe is thermally coupled to the heat dissipation fin, and the heat dissipation fin corresponds to the air outlet configuration of the fan. In detail, the heat generated by the heat source inside the host can be transferred to the condensation end through the evaporation end of the heat pipe, and then transferred to the heat dissipation fin from the condensation end. The cold air blown from the air outlet of the fan to the heat dissipation fin exchanges heat with the heat dissipation fin to form hot air, which is then forced out to the outside. In this way, heat accumulation inside the host is avoided, so as to maintain the computing performance of the notebook computer.

However, the fan introduces cold air into the host from the outside, and it is difficult to avoid dust from the outside being also introduced into the host and blown to the heat dissipation fin. Over a long period of time, dust will accumulate on the heat dissipation fin, resulting in a decline in heat dissipation efficiency.

SUMMARY

The invention provides a portable electronic device, which not only has good heat dissipation efficiency, but also is convenient for users to operate.

A portable electronic device including a casing, a heat source, a fan, a heat dissipation fin, a heat pipe and a dust collecting member is provided. The heat source, the fan, the heat dissipation fin, and the heat pipe are located inside the casing, and the heat pipe is thermally coupled between the heat source and the heat dissipation fin. The dust collecting member is detachably assembled to the casing and is inserted into the casing. The heat dissipation fin is disposed as corresponding to the fan, and the dust collecting member is located between the fan and the heat dissipation fin.

A portable electronic device including a first body, a second body pivoted to the first body and a dust collecting member is provided. The first body includes a casing, a heat source, a fan, a heat dissipation fin, a heat pipe and a dust collecting member. The heat source, the fan, the heat dissipation fin, and the heat pipe are located inside the casing, and the heat pipe is thermally coupled between the heat source and the heat dissipation fin. The dust collecting member is detachably assembled to the casing and is inserted into the casing. The heat dissipation fin is disposed as corresponding to the fan, and the dust collecting member is located between the fan and the heat dissipation fin.

Based on the above, the portable electronic device of the invention is provided with a dust collecting member between the fan and the heat dissipation fin to collect the dust blown from the fan to the heat dissipation fin, so as to prevent dust from accumulating on the heat dissipation fin and improve heat dissipation efficiency. On the other hand, the dust collecting member is detachably installed on the casing, and the user can periodically remove the dust collecting member from the casing. After removing the dust adsorbed or attached to the dust collecting member, install the dust collecting member back into the casing. Therefore, it is not only easy and intuitive to operate, but also conducive to maintaining the dust collection effect.

In order to make the above-mentioned features and advantages of the present application more obvious and easier to understand, the following specific examples are given, and are described in detail as follows in conjunction with the accompanying drawings.

DESCRIPTION OF THE EMBODIMENTS

Figure 1:
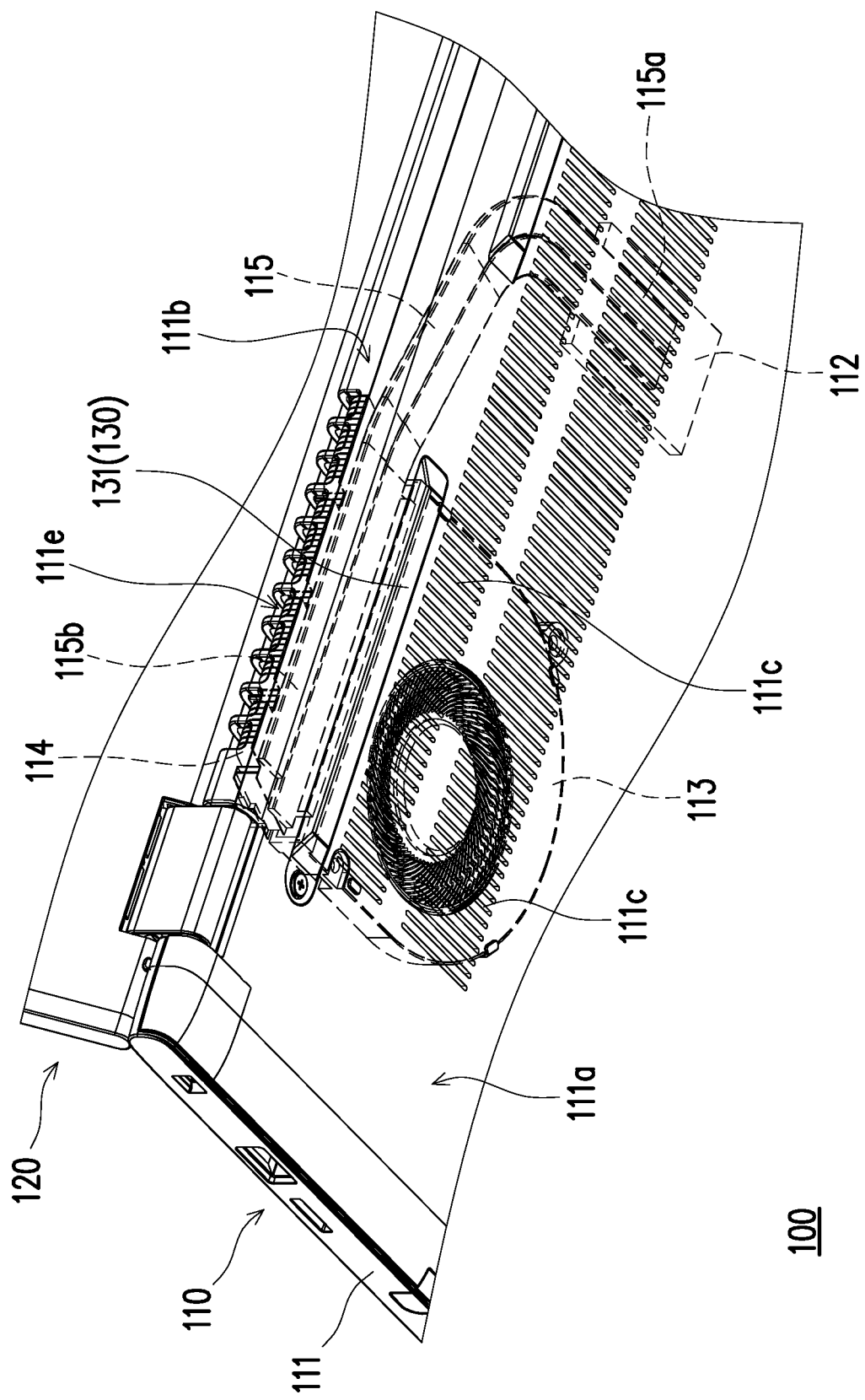
FIG. 1 is a partially enlarged schematic diagram of a portable electronic device according to an embodiment of the invention.
Figure 2:
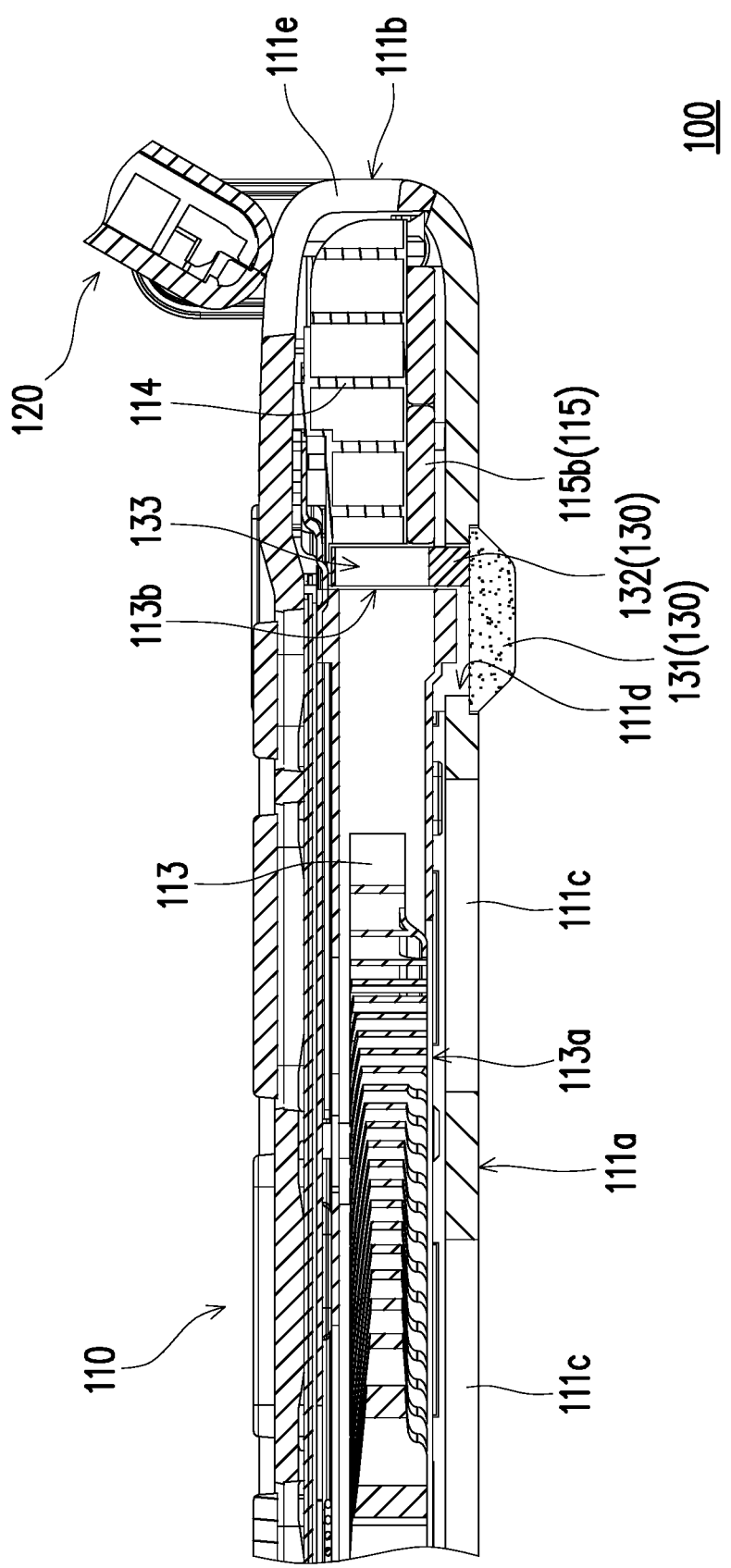
FIG. 2 is a partial cross-sectional schematic diagram of the portable electronic device in FIG. 1.
Figure 3:
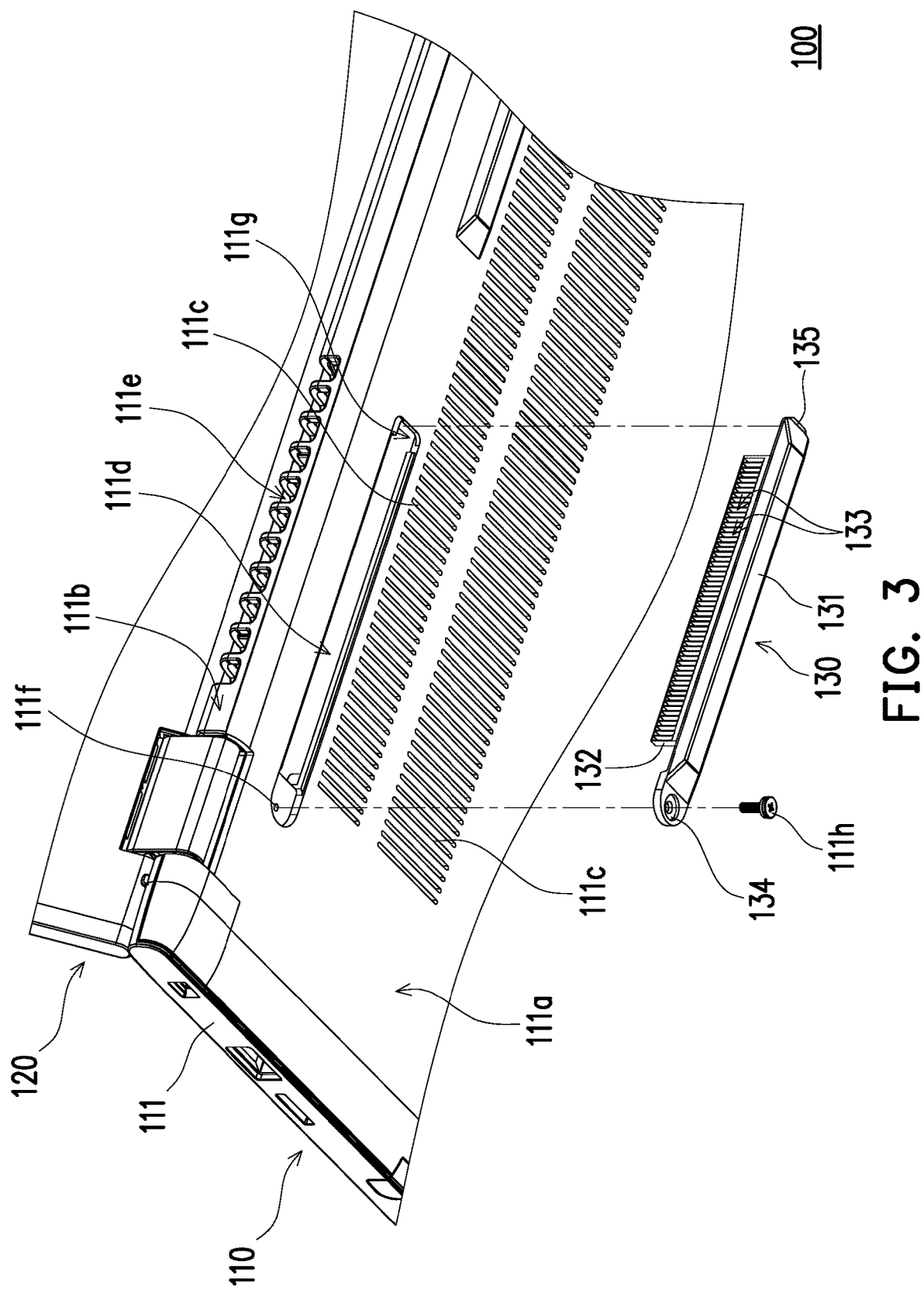
FIG. 3 is a partially enlarged schematic diagram of the detached casing of a dust collecting member of FIG. 1.

FIG. 1 is a partially enlarged schematic diagram of a portable electronic device according to an embodiment of the invention. FIG. 2 is a partial cross-sectional schematic diagram of the portable electronic device in FIG. 1. FIG. 3 is a partially enlarged schematic diagram of the detached casing of the dust collecting member of FIG. 1. Referring to FIG. 1, in the embodiment, the portable electronic device 100 can be a notebook computer, and includes a first body 110, a second body 120 pivoted to the first body 110 and a dust collecting member 130 detachably installed on the first body 110. The first body 110 has logic operation and data access capabilities, and the second body 120 has display capabilities.

As shown in FIG. 1 to FIG. 3, first body 110 comprises a casing 111, heat source 112, a fan 113, a heat dissipation fin 114 and a heat pipe 115. And the heat source 112, the fan 113, the heat dissipation fin 114 and the heat pipe 115 are located in the casing 111. The heat dissipation fin 114 is set corresponding to the fan 113, and an evaporation end 115$a$ and a condensation end 115$b$ of the heat pipe 115 are thermally coupled to the heat source 112 and the heat dissipation fin 114 respectively. The casing 111 has a bottom surface 111$a$, a rear side 111$b$ connected to the bottom surface 111$a$, an air inlet hole 111$c$ located on the bottom surface 111$a$, a mounting opening 111$d$ located on the bottom surface 111$a$ and a heat dissipation hole 111$e$ located on the rear side 111$b$. The dust collecting member 130 is detachably mounted on the bottom surface 111a of the casing 111, and inserted into the inside of the casing 111 through the mounting opening 111d.

The fan 113 can be a centrifugal fan, wherein the heat dissipation fin 114 is set corresponding to the fan 113, and the dust collecting member 130 is located between the fan 113 and the heat dissipation fin 114. In detail, the fan 113 has an air inlet 113a corresponding to the air inlet hole 111c and an air outlet 113b corresponding to the heat dissipation fin 114. The heat dissipation fin 114 is set corresponding to the heat dissipation hole 111e, and is located between the air outlet 113b of the fan 113 and the heat dissipation hole 111e of the casing 111. On the other hand, the mounting opening 111d is located between the air inlet hole 111c and the heat dissipation hole 111e. The dust collecting member 130 inserted into the casing 111 through the mounting opening 111d is located between the air inlet hole 111c and the heat dissipation hole 111e, and is located between the air outlet 113b of the fan 113 and the heat dissipation fin 114.

When the cold air is blown from the air outlet 113b of the fan 113 to the heat dissipation fin 114, the cold air and the dust flowing with the cold air will first flow through the dust collecting member 130, and the dust will be adsorbed or attached to the dust collecting member 130. In this way, dust is prevented from being blown to the heat dissipation fin 114 and accumulated in the heat dissipation fin 114, so as to improve heat dissipation efficiency. On the other hand, the user can regularly disassemble the dust collecting member 130 from the casing 111, and install the dust collecting member 130 back to the casing 111 after removing the dust adsorbed or attached to the dust collecting member 130. Therefore, it is not only easy and intuitive to operate, but also conducive to maintaining the dust collection effect.

As shown in FIG. 2 and FIG. 3, in the embodiment, the dust collecting member 130 includes a foot pad part 131 and a dust collecting part 132 connected to the foot pad part 131. The foot pad part 131 can be made of rubber, silicone or other suitable materials, and protrudes from the bottom surface 111a of the casing 111. Since the foot pad part 131 protrudes from the bottom surface 111a of the casing 111, the foot pad part 131 can support the casing 111. Therefore, there is a gap between the bottom surface 111a of the casing 111 and the working plane, so as to increase the flow rate of the fan 113 to introduce the cold air from outside to the inside of the casing 111 through the air inlet hole 111c.

On the other hand, the dust collecting part 132 is inserted into the casing 111, and is located between the air outlet 113b of the fan 113 and the heat dissipation fin 114. The dust collecting part 132 can be a metal grille, and has a plurality of grooves 133, which is not only beneficial for collecting dust, but also beneficial for blowing cold air to the heat dissipation fin 114.

As shown in FIG. 2 and FIG. 3, in the embodiment, the foot pad part 131 has a first mounting end 134 and a second mounting end 135 relative to the first mounting end 134, and the casing 111 also has a first positioning portion 111f and a second positioning portion 111g relative to the first positioning portion 111f. The first positioning portion 111f and the second positioning portion 111g are located in the mounting opening 111d, wherein the first mounting end 134 is installed in the first positioning portion 111f, and the second mounting end 135 is installed in the second positioning portion 111g. The first mounting end 134 and first positioning portion 111f can be a combination of two lock holes, and the first mounting end 134 and first positioning portion 111f are fixed by a screw 111h locking. In addition, the second mounting end 135 and the second positioning portion 111g can be a combination of card protrusions and card slots engaged with each other.

In another embodiment, the first mounting end and the first positioning portion can be a combination of a card protrusion and a card slot that engage with each other. In addition, the second mounting end and the second positioning portion can be a combination of two lock holes, and the second mounting end and the second positioning portion can be fixed by the screw locking.

In another embodiment, the first mounting end and the first positioning portion can be a combination of two lock holes, and the first mounting end and the first positioning portion are fixed by the screw locking. Similarly, the second mounting end and the second positioning portion can be a combination of two lock holes, and the second mounting end and the second positioning portion are fixed by the screw locking.

In another embodiment, the first mounting end and the first positioning portion may be a combination of card protrusions and card slots engaged with each other. Similarly, the second mounting end and the second positioning portion may be a combination of card protrusions and card slots engaged with each other.

Figure 4:
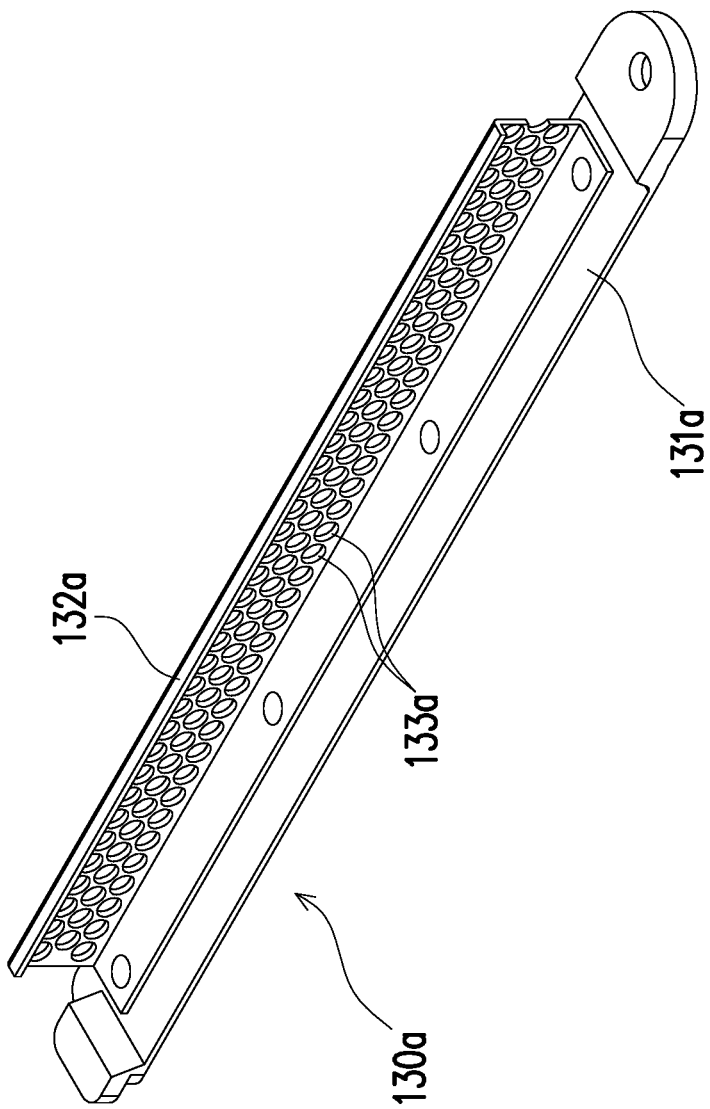
FIG. 4 is a schematic diagram of a dust collecting member of another embodiment of the invention.

FIG. 4 is a schematic diagram of a dust collecting member of another embodiment of the invention. The design principle of the dust collecting member 130a of the embodiment is substantially the same as that of the dust collecting member 130 of the previous embodiment. The difference is that in this embodiment, the dust collecting part 132a of the dust collecting member 130a can be a metal mesh plate connected to the foot pad part 131a, and has a plurality of openings 133a to facilitate dust collection and airflow.

Figure 5:
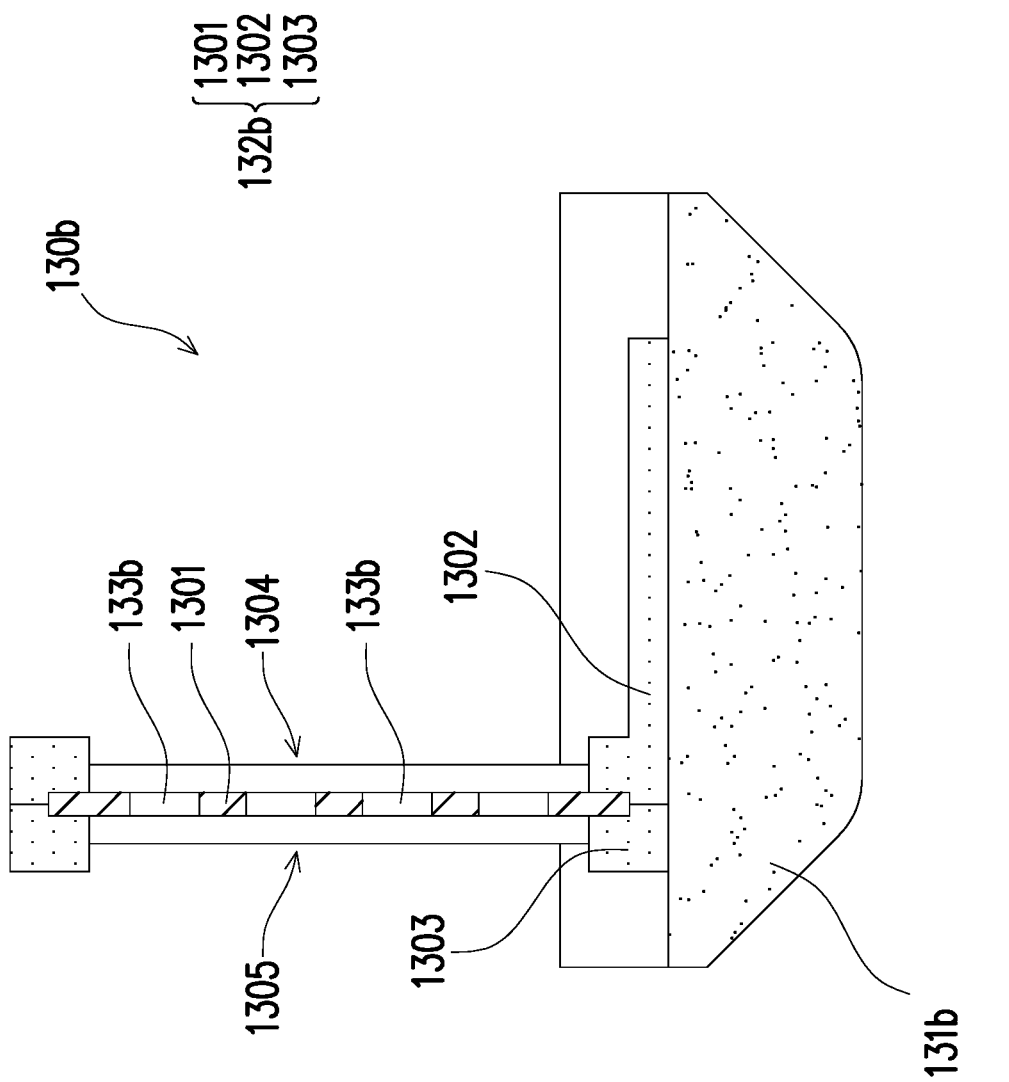
FIG. 5 is a schematic cross-sectional view of a dust collecting member of another embodiment of the invention.

FIG. 5 is a schematic cross-sectional view of a dust collecting member of another embodiment of the invention. The design principle of the dust collecting member 130b of the embodiment is substantially the same as that of the dust collecting member 130 of the previous embodiment. The difference is that in this embodiment, the dust collecting part 132b of the dust collecting member 130b includes a metal mesh plate 1301, a first positioning frame 1302 and a second positioning frame 1303 relative to the first positioning frame 1302. The first positioning frame 1302 and the second positioning frame 1303 are connected to the foot pad part 131b, and the metal mesh plate 1301 is clamped and positioned between the first positioning frame 1302 and the second positioning frame 1303. The metal mesh plate 1301 has a plurality of openings 133b to facilitate dust collection and airflow. Further, the first positioning frame 1302 has ventilation openings 1304 connected to the plurality of openings 133b, and the second positioning frame 1303 has ventilation openings 1305 connected to the plurality of openings 133b to facilitate airflow.

In summary, the portable electronic device of the invention is provided with a dust collecting member between the fan and the heat dissipation fin to collect the dust blown from the fan to the heat dissipation fin, so as to prevent dust from accumulating on the heat dissipation fin and improve heat dissipation efficiency. On the other hand, the dust collecting member is detachably installed on the casing, and the user can periodically remove the dust collecting member from the casing. After removing the dust adsorbed or attached to the dust collecting member, install the dust collecting member back into the casing. Therefore, it is not only easy and intuitive to operate, but also conducive to maintaining the dust collection effect. In addition, the dust collecting member includes a protruding foot pad part facing the bottom surface of the casing, and is used to support the casing.

Therefore, there is a gap between the bottom surface of the casing and the working plane to improve the flow of cold air from the outside into the inside of the casing by the fan.

Although the present application has been disclosed as above with embodiments, it is not intended to limit the present application, any person with ordinary knowledge in the technical field, without departing from the spirit and scope of the present application, can make some changes. Therefore, the protection scope of the present application shall be determined by the scope of the claims.

What is claimed is:

1. A portable electronic device, comprising:
   a casing;
   heat source;
   a fan;
   a heat dissipation fin;
   a heat pipe, wherein the heat source, the fan, the heat dissipation fin, and the heat pipe are located inside the casing, and the heat pipe is thermally coupled between the heat source and the heat dissipation fin; and
   a dust collecting member, detachably assembled to the casing and is inserted into the casing, wherein the heat dissipation fin is disposed as corresponding to the fan, and the dust collecting member is located between the fan and the heat dissipation fin;
   wherein the casing has a bottom surface and a mounting opening located on the bottom surface, and the dust collecting member is detachably mounted on the bottom surface, and the dust collecting member is inserted inside the casing through the mounting opening;
   wherein the dust collecting member comprises a foot pad part and a dust collecting part connected to the foot pad part, and the foot pad part protrudes from the bottom surface, the dust collecting part is inserted inside the casing, and is located between the fan and the heat dissipation fin;
   wherein the dust collecting part comprises a metal mesh plate, a first positioning frame and a second positioning frame opposite the first positioning frame, the first positioning frame and the second positioning frame are connected to the foot pad part, and the metal mesh plate is clamped and positioned between the first positioning frame and the second positioning frame.

2. The portable electronic device according to claim 1, wherein the casing also has a rear side connected to the bottom surface, an air inlet hole located on the bottom surface and a heat dissipation hole located on the rear side, and the mounting opening is located between the air inlet hole and the heat dissipation hole.

3. The portable electronic device according to claim 2, wherein the fan has an air inlet corresponding to the air inlet hole and an air outlet corresponding to the heat dissipation fin, and the heat dissipation fin is located between the air outlet and the heat dissipation hole.

4. The portable electronic device according to claim 2, wherein the fan has an air outlet corresponding to the heat dissipation fin, and the dust collecting member is located between the air outlet and the heat dissipation fin.

5. The portable electronic device according to claim 1, wherein the dust collecting part comprises a metal grille or a metal mesh plate.

6. The portable electronic device according to claim 1, wherein the foot pad part has a first mounting end and a second mounting end opposite to the first mounting end, and the casing further has a first positioning portion and a second positioning portion relative to the first positioning portion, and the first positioning portion and the second positioning portion are located within the mounting opening, wherein the first mounting end is mounted on the first positioning portion, and the second mounting end is mounted on the second positioning portion.

7. The portable electronic device according to claim 6, wherein the first mounting end and the first positioning portion are a combination of two locking holes, and the second mounting end and the second positioning portion are a combination of a card protrusion and a card slot, the first mounting end and the first positioning portion are secured to each other by screw locking.

8. A portable electronic device, comprising:
   a first body, comprises:
      a casing;
      heat source;
      a fan;
      a heat dissipation fin; and
      a heat pipe, wherein the heat source, the fan, the heat dissipation fin, and the heat pipe are located inside the casing, and the heat pipe is thermally coupled between the heat source and the heat dissipation fin;
   a second body, pivoted to the first body; and
   a dust collecting member, detachably assembled to the casing and is inserted into the casing, wherein the heat dissipation fin is disposed as corresponding to the fan, and the dust collecting member is located between the fan and the heat dissipation fin;
   wherein the casing has a bottom surface and a mounting opening located on the bottom surface, and the dust collecting member is detachably mounted on the bottom surface, and the dust collecting member is inserted inside the casing through the mounting opening;
   wherein the dust collecting member comprises a foot pad part and a dust collecting part connected to the foot pad part, and the foot pad part protrudes from the bottom surface, the dust collecting part is inserted inside the casing, and is located between the fan and the heat dissipation fin;
   wherein the dust collecting part comprises a metal mesh plate, a first positioning frame and a second positioning frame opposite the first positioning frame, the first positioning frame and the second positioning frame are connected to the foot pad part, and the metal mesh plate is clamped and positioned between the first positioning frame and the second positioning frame.

* * * * *